Feb. 9, 1960 D. K. SCHAEVE 2,924,757

PHASE-SENSITIVE AMPLIFIER

Filed June 18, 1954 2 Sheets-Sheet 1

INVENTOR.
Donald K. Schaeve
BY
Carlson, Pitzner, Hubbard & Wolfe
ATTORNEYS

Feb. 9, 1960 D. K. SCHAEVE 2,924,757

PHASE-SENSITIVE AMPLIFIER

Filed June 18, 1954 2 Sheets-Sheet 2

INVENTOR.
Donald K. Schaeve
BY
Carlson, Pitzner, Hubbard & Wolfe
ATTORNEYS

United States Patent Office 2,924,757

Patented Feb. 9, 1960

2,924,757

PHASE-SENSITIVE AMPLIFIER

Donald K. Schaeve, Rockford, Ill., assignor to Barber-Colman Company, Rockford, Ill., a corporation of Illinois Application June 18, 1954, Serial No. 437,731

12 Claims. (Cl. 317—148.5)

This invention relates to phase-sensitive amplifiers employing transistors.

In many electric circuit applications it is desired to operate a direct current sensitive device from a small alternating current signal and also to have the direction of the direct current changed in response to phase reversal of the input signal. In many instances it is further desired that the direct current output amplitude also continuously correspond to the degree of phase or amplitude modulation of the alternating signal. It is also especially advantageous to employ transistors as the amplifying element in such circuits in view of their known advantages of low voltage and power requirements. At the same time, it is important that the inherent circuit simplicity and economy of cost and space should not be offset by the variation of the transistor characteristics either with time or between units or by adverse effects of temperature variations.

It is therefore an object of my invention to provide a simple and improved directional phase-sensitive amplifier employing transistors.

It is another object of my invention to provide a transistor amplifier stage for producing a direct current output signal responsive to the modulation of an alternating current input signal.

It is still another object of my invention to provide a transistor power amplifier requiring very few circuit components and capable of embodiment in compact physical form.

It is a further object of my invention to provide a transistor amplifier circuit having a high degree of stability and tolerance to variation of transistor characteristics.

Other objects and advantages of the invention will become apparent as the description proceeds and in view of the accompanying drawings in which.

Figure 1:
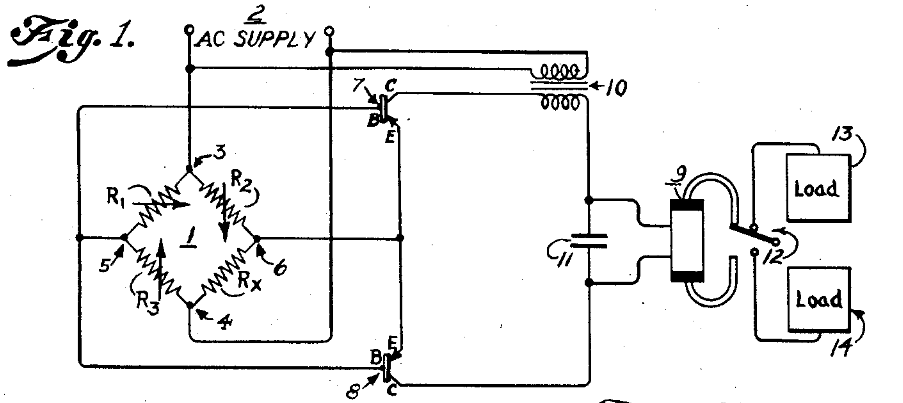
Figure 1 is a phase-sensitive amplifier employing transistors in accordance with my invention.

While the invention is susceptible of various modifications and alternative constructions, I have shown in the drawings and will herein describe in detail the preferred embodiments, but it is to be understood that I do not thereby intend to limit the invention to the specific forms or modifications disclosed, but intend to cover all such modifications and alternatives and equivalents falling within the spirit and scope of the invention as expressed in the appended claims.

Referring now to the drawings, and particularly to Fig. 1, a phase-sensitive amplifier is shown employed to amplify the signal from a source such as the alternating current Wheatstone bridge 1. This bridge may suitably be of a conventional type having four resistance units connected in series circuit, three of the resistors $R_1$, $R_2$, and $R_3$ being fixed or pre-set, with the value of the fourth resistance $R_x$ varying as a function of some measured quantity, such as temperature or pressure, for example. The bridge is energized by the application of the potential of an alternating current supply source 2, such as the conventional 115 volt, 60 cycle line, across one pair of opposite bridge corners 3 and 4, and an alternating signal potential appears between the other pair of opposite corners 5 and 6. The phase of the signal—that is, in this case, whether or not the polarity is reversed—indicates that the measured quantity is either above or below the bridge balance point, and the signal magnitude indicates the extent to which the bridge is off balance. The same is true for a precision measurement type of bridge in which $R_1$, $R_2$, and $R_3$ are varied to find the null or balance point of the bridge which may be passed in either direction by varying amounts in attempting to determine the value of $R_x$.

Figure 2:
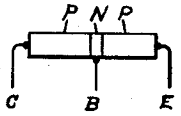
Fig. 2 represents a junction transistor of the type suitably employed in the apparatus of Fig. 1.

A pair of similar transistors 7 and 8, preferably of the junction type and each having collector, base, and emitter electrodes, respectively, as indicated by the symbols C, B, and E in Fig. 1 and also in Fig. 2, are employed to demodulate and amplify the input signal from the bridge corners 5 and 6. To this end, the emitters E of the transistors are connected together and to the bridge terminal 6 and the transistor bases B are connected together and to the terminal 5. The output circuit comprises a polarized relay conventionally indicated at 9 having a resistive winding in series with the secondary winding of a transformer 10 energized from the alternating current supply source 2 to provide both the amplifying power and the standard for phase comparison. This output circuit is connected between the collectors C of the transistors 7 and 8 to complete the circuit. A smoothing filter, such as represented by the capacitor 11 may also be connected between the coil terminals of the relay in the output circuit. The resistance and voltage of the output circuit are both suitably several times higher than the respective resistance and voltage of the input circuit. As generally shown in Fig. 1, a conventional single-pole double-throw contact arrangement 12 of the directional relay 9 closes either one of the two load circuits 13 or 14.

While the transistors 7 and 8 are suitably conventional in form and hence not fully described herein, a brief resume of their operating characteristics so far as pertinent to the present invention may be helpful in appreciating the invention itself. These devices can perhaps be most simply explained in terms of the rectifying barriers created between adjoining zones of opposite conduction direction characteristics created by the presence of traces of activator impurities in a body of semi-conducting material such as monocrystalline germanium. The base is one of the zones, designated as either P- or N-type material (positive or negative) and it adjoins both the collector and emiter zones, which are both of the opposite type material. The rectifying barriers have a very low impedance to current flow from a P-zone to an N-zone and a very high impedance (preferably essentially non-conducting) in the other direction. A typical junction-type transistor shown in Fig. 2 is the P–N–P unit, the base being the N-type material. Assuming the transistors 7 and 8 to be polarized P–N–P, the current from the emitter to the base is in the easy flow direction, so that only a small positive voltage with respect to the base on the emitter electrode is required for a relatively large current flow. With the collector biased negatively with respect to the base (and thus in the reverse or high impedance direction), the current is restricted to a usually negligibly small value except that during emitter current flow the collector current increases as a function of the emitter current, the emitter being considered to inject conduction carriers into the base which are attracted to the collector rather than to the less negative base electrode. The ratio of the collector current increase to the emitter current increase for a given collector voltage is the amplification factor $\alpha$. While $\alpha$ or the current gain is somewhat less than unity for junction transistors, the output resistance of the amplifier can be much higher than its input resistance and substantial power or voltage gain can be realized. Suitable gain has been obtained with an input impedance of the order of five hundred to one thousand ohms and an output impedance ten times as large. The current gain factor in transistors employed here is approximately .9 to .99, and while a P–N–P unit has been described, it should be understood that N–P–N units can be substituted, provided the applied potentials are also reversed.

The operation of the circuit of Fig. 1 may be more easily understood by first disregarding for the moment the effect of the emitter electrodes, in which case the base-collector junctions of the transistors 7 and 8 may be considered to act as rectifiers connected back-to-back in series with the alternating current power source 10 and relay device 9. For a power source half cycle of either polarity, one or the other of the rectifiers presents its inverse or high impedance to current flow, substantially blocking the current.

Next, considering the effect of the emitters during half cycles when the input signal source biases both of them negatively with respect to the bases, the transistors are driven further into the non-conducting state. Thus, during those alternate half-cycles, the output current is substantially zero or at most only a small current is permitted, depending upon the back resistance of the transistors.

However, a unidirectional current in the output circuit is obtained during the other alternate half cycles when the P-type emitters are positive with respect to the N-type base. The emitters are then biased in the easy flow direction so that they tend to inject positive conduction carriers into the collector zones. Relating the phases of the input signal and the output voltage source 10 to one of the transistors, the sources may be considered to be in phase when they cause current flow through one of the transistors from the emitter to the collector. With emitter is in phase with the output voltage from the respect to transistor 7, the input signal applied to its source 10 applied to its collector when the terminal 6 of the input bridge is positive with respect to terminal 5 and when the collector is simultaneously negative with respect to the emitter. During the particular half cycles when this condition applies to transistor 7, current flows through the output circuit at an amplitude varying with the amplitude of the emitter signal. During these same half cycles, the other transistor 8 has its collector positively biased in the easy flow direction so that little impedance is presented to the flow of output current from its collector to its base.

Thus the output circuit, when the transistor 7 controls the current flow as the active transistor, may be traced as follows: from the secondary winding of transformer 10 through the coil of the relay 9 to the collector C of transistor 8, through the collector-to-base junction of transistor 8, from the base to terminal 5 of the bridge 1, dividing and flowing through the bridge arms to terminal 6, thence to the emitter E of transistor 7, through the emitter-base junction and the base-collector junction of transistor 7, and from the collector to the secondary winding of transformer 10. During the opposite signal phase the output current flows in the opposite direction and the functions of transistors 7 and 8 are simply reversed. During the phase condition when transistor 7 controls the flow, transistor 8 functions as a rectifier whose electrodes are the collector and the base. The ohmic resistance to current flow from the collector terminal to the base terminal of transistor 8 presented by the base-collector junction and semi-conducting path of the base material through the base of transistor 8 causes a voltage drop which reduces the positive potential of the emitter of transistor 8 with respect to the base. This reduces or substantially eliminates signal current through transistor 8, and hence substantially restricts the input signal drain to that required for effective output current control in transistor 7.

Should the signal voltage polarity be reversed, as caused by a change of $R_x$ in the opposite direction from the balance point or by too large an adjustment of the bridge resistors $R_1$, $R_2$, and $R_3$, the emitters will be positively biased only during those alternate half cycles when the collector of transistor 7 is positively biased and the collector of transistor 8 is negatively biased. When this is the case, transistor 8 assumes control of the output current and the collector-base junction of transistor 7 is biased in the easy flow direction. The amplitude of the output signal again varies with the amplitude of the input signal. This exchange of control between transistors 7 and 8 with phase reversal is seen to follow from the fact that the collectors change in polarity every half cycle due to the fact that they are connected in series with the alternating output source while the emitters simultaneously change polarity every half cycle since they are connected in parallel to the alternating input signal source.

Figure 3:
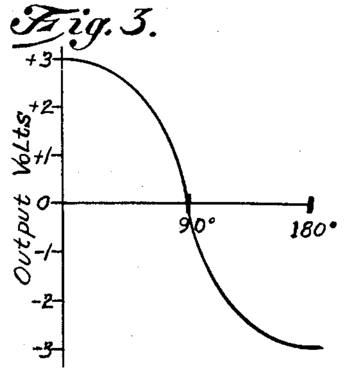
Fig. 3 is a curve showing the relation between the direct current output signal and the phase modulation of the input signal for a given input signal amplitude.

Since phase reversal of the input signal determines during which of the alternate half cycles of output voltage that output current will flow, the polarity of the output current and of the voltage across the directional relay 9 is thereby determined. Thus when transistor 7 controls the current flow, the voltage drop across the relay corresponds to that positive maximum value shown for zero phase difference in Fig. 3. Using the same polarity convention, when phase difference between the input and output signals is reversed, the phase difference is 180° (or in phase with respect to transistor 8) and the voltage drop across the relay has an equal but negative amplitude as indicated in Fig. 3. The relay 9 thus opens or closes at a predetermined input signal level either of indicating or control circuits 13 or 14 according to the input signal phase. It is obvious, of course, that other forms of signal sources and load devices or circuits may be usefully employed without departing from the spirit of my invention.

While the circuit of Fig. 1 illustrates the application of my invention to means for obtaining an amplified output voltage corresponding to the polarity and amplitude of an input signal such as from the alternating current bridge 1 of Fig. 1, all degrees of phase difference between the input and output signals may be detected as further suggested by Fig. 3. As may be seen, the curve of Fig. 3 varies substantially sinusoidally from a plus or positive maximum direct current output voltage at zero degrees phase difference to a negative maximum output voltage at 180° phase difference to provide at a given input signal amplitude a unique output signal value for every phase difference over the 180° range.

Figure 4:
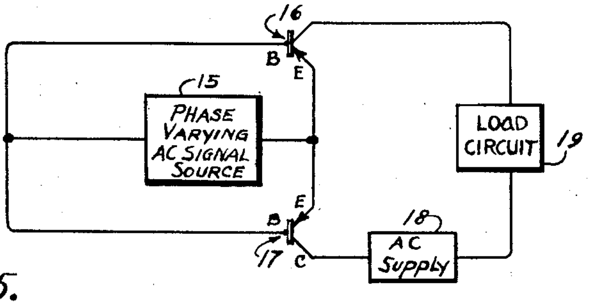
Fig. 4 is a generalized representation of a phase-sensitive amplifier embodying my invention.

Illustrative of a circuit responsive to the entire phase varying range of Fig. 3 is the generalized phase responsive amplifier of Fig. 4. As shown therein, a source of phase varying input signals 15 provides an input emitter current and is connected between the parallel-connected emitters E and parallel-connected bases B, respectively, of similar junction transistors 16 and 17. The signal source 15 may be any of a number of equivalents for this purpose. To mention a few, the source 15 might well be a preamplifier, either electronic or magnetic or itself employing transistors, a variable differential transformer, or a special circuit, such as a discriminator or demodulator. A bridge circuit as in Fig. 1, for example, may be arranged to include reactive components in which case the signal phase as well as the amplitude varies with variation in value of the bridge components. An output circuit comprising an alternating current supply source 18 of the same frequency as the phase varying input signal source is connected in series with any suitable load circuit 19 between the collectors C of transistors 16 and 17. The load circuit may suitably take the form of a phase indicating instrument or a directional relay such as indicated in Fig. 1, it being understood that the load device has a high resistance relative to the input resistance to produce the desired gain. Again it should be recognized that the range of useful current responsive load devices for indicating, measuring, and control purposes is broad and includes the input circuits of subsequent amplifier stages of various types.

The circuit of Fig. 4 operates generally in the manner described with respect to that of Fig. 1 except that, providing the phase varying input signal has a constant amplitude, the amplitude and direction of the pulsating direct current output signal correspond to the difference in phase between signals of the input source 15 and the supply voltage from the output source or supply 18. Since comparison is a relative measure, the signal source 15 may be a low power standard signal with which variations in the output source 18 are compared or synchronized. While either the phase or amplitude of the input signal may vary, it is desirable so far as obtaining a unique output vector value for each input condition is concerned, preferably only one of these conditions is continuously variable.

Figure 5:
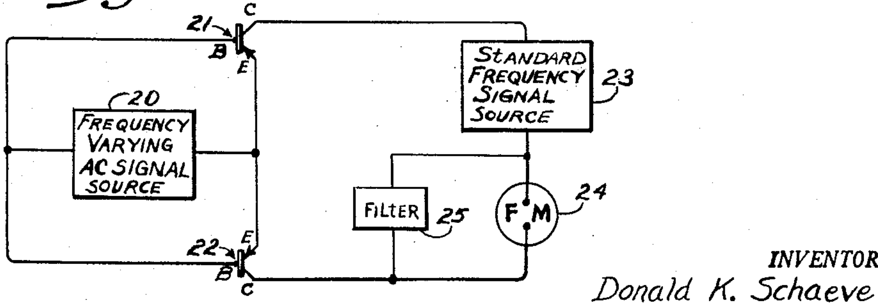
Fig. 5 represents an amplifier circuit according to my invention as modified to measure frequency change.

In those instances where the phase of the input signal changes more than 180° with respect to the output voltage, the circuit may be employed as a frequency meter or frequency responsive control, such as for frequency synchronizing. Such an arrangement is shown in Fig. 5 where a source of a variable frequency input signal 20 is connected in the manner previously shown between the emitters and bases of transistors 21 and 22 having as an output circuit between their collectors a standard frequency signal source 23 and a frequency meter or other frequency responsive load device 24. With such an arrangement, a change in frequency between the input and output signal sources provides an alternating output comparison signal of frequency equal to the frequency difference. A suitable filter 25 is employed to by-pass alternating components at the frequency of the standard source. The requirement of the filter 25 so far as removing the standard signal frequency depends upon the extent to which output current flows against the reverse or back impedance of the transistors 21 and 22.

Figure 6:
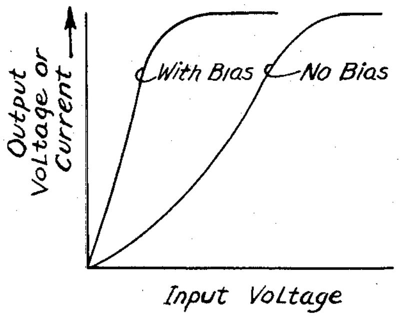
Fig. 6 is a graphic representation of the variation of output current with input signal amplitude for a given phase relation and also showing the effect of an emitter bias current.

The emitters of the transistors as employed in circuits embodying my invention may also be biased to lower the input impedance of the amplifier at low signal levels by overcoming the initial high resistance associated with the emitters at low current levels. The voltage sensitivity, rather than the current sensitivity, is particularly effected by the use of the bias current, Fig. 6 showing operating characteristics, for a given phase difference, of output voltage or current amplitude versus input voltage. As may be seen, by the employment of the bias current in the emitter input circuit, the characteristic has an initial portion of much steeper slope, thus providing a greater degree of input voltage sensitivity.

Figure 7:
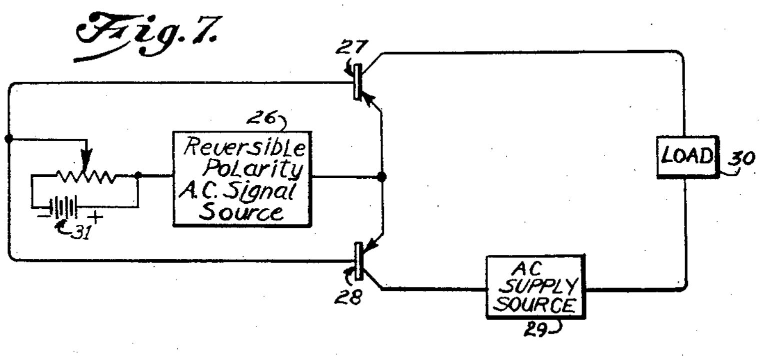
Fig. 7 represents an amplifier circuit incorporating my invention as modified to provide emitter bias.

A modified circuit incorporating my invention and having increased input voltage sensitivity is shown in Fig. 7. In this case the alternating current input signal source 26 is indicated as a reversible polarity source. With such a type of signal source, which may be for example, of the nature of that specifically illustrated in Fig. 1, the need for voltage sensitivity is apt to be particularly great since the signal voltage has an extended low amplitude range as it passes through zero amplitude in reversing polarity. Transistors 27 and 28 corresponding in type and polarity to transistors 7 and 8 of the embodiment shown in Fig. 1 are also employed together with an alternating current supply 29 and load 30 in the output circuit between the transistor collector electrodes. A source of direct current 31 for biasing the emitters suitably takes the form of a battery having a resistor connected across its terminals together with an adjustable tap on the resistor to adjustably divide the voltage and produce the desired bias current. In accordance with my invention, the bias is made effective for both of the transistors 27 and 28 by including it in the input circuit in series with the source 26, and is polarized to place the emitters at a slight positive potential with respect to the bases.

In operation, the circuit of Fig. 7 is generally similar to that of Fig. 1, but the bias current provided by the source 31 provides greater sensitivity by effectively adjusting the operating point of the transistors. With the bias voltage source injecting current into the base by reason of the slight positive potential applied to each emitter, a slight voltage change in the source 26 produces an output current change, so long as the amplifier is operating on a low input voltage or initial portion of the bias operating characteristic indicated in Fig. 6. As in the other circuits described, it is to be appreciated, of course, that the load means 30 may take a number of forms for purposes of indication, measurement, or control.

Accordingly it may be seen that the phase sensitive amplifiers incorporating my invention are simply and economically constructed and operated, and yet capable of providing an amplified output signal responsive to the input signal amplitude and phase. In addition, since the effect of temperature changes on the transistors generally results in an increase of collector current at zero emitter current, only the alternating component of current in the load is increased. If the pair of transistors have similar characteristics, the amplitude or direction of the amplifier output current is not changed. The current is also insensitive to aging or other characteristic changes to the extent that the transistors of the pair involved vary similarly, and generally any pair of junction transistors with normal characteristics produce good operation.

While I have described the amplifier construction as employing the junction type of transistors, it should be understood that point contact transistors operate in essentially the same manner except that in commercially available transistors, the back or inverse resistance of the junction type is ordinarily much greater and hence more desirable in so far as reduction of the alternating component in the output circuit is concerned. Similarly, the transistors have been described as separate conventional units having their emitters and bases respectively connected in parallel, but other transistor structures incorporating dual element arrangements may be substituted. Obviously various types of filter means may also be employed for removing alternating current components or for smoothing the pulsed direct current output of the circuits of Figs. 1, 4, and 7.

I claim as my invention:

1. A phase-sensitive amplifier comprising similarly polarized first and second transistors each having emitter, base, and collector electrodes with said base electrodes and said emitter electrodes respectively connected together, an input circuit comprising an alternating signal source of given frequency connected between said emitter electrodes and said base electrodes, and an output circuit comprising a source of alternating power of said frequency and a load device connected in series between said collector electrodes.

2. A phase-sensitive amplifier comprising similarly polarized first and second transistors each having emitter, base, and collector electrodes with said base electrodes and said emitter electrodes respectively connected together, an input circuit comprising an alternating signal source of given frequency connected between said emitter electrodes and said base electrodes, and an output circuit comprising a source of alternating power of said frequency and a load device connected in series between said collector electrodes, said output circuit including a filter.

3. A phase-sensitive amplifier comprising similarly polarized first and second transistors each having emitter, base, and collector electrodes with said base electrodes and said emitter electrodes respectively connected together, an input circuit comprising an alternating signal source of given frequency connected between said emitter electrodes and said base electrodes, and an output circuit comprising a source of alternating power of said frequency and a load device connected in series between said collector electrodes, said output circuit having a substantially greater impedance than said input circuit.

4. An amplifier circuit comprising similarly polarized first and second transistors each having emitter, base, and collector electrodes, means connecting the base electrodes of said first and second transistors to one terminal of an alternating signal source, means connecting the emitters of said first and second transistors to the other terminal of said source, and an output circuit comprising a second alternating current source and load device connected in series between the collector electrodes of said first and second transistors.

5. A phase-sensitive amplifier comprising similarly polarized first and second junction transistors each having emitter, base, and collector electrodes, means connecting said bases and said emitters respectively together, an alternating input signal source of given frequency subject to phase reversal connected between said emitters and said bases, a source of alternating current power of said frequency, a polarized relay having an actuating coil, and means connecting said power source and said actuating coil in series between said collector electrodes to provide a pulsating direct output current reversible in polarity with phase reversal of said input signal.

6. A phase sensitive amplifier comprising similarly polarized first and second junction transistors each having emitter, base, and collector electrodes, means connecting said bases together and means connecting said emitters together, an alternating input signal source of given frequency subject to phase reversal connected between said emitters and said bases, a source of alternating current power of said frequency, a current sensitive load device, and means connecting said power source and said load device in series between said collector electrodes to provide a pulsating direct output current reversible in polarity with phase reversal of said input signal.

7. A phase sensitive amplifier comprising similarly polarized first and second junction transistors each having emitter, base, and collector electrodes, means connecting said bases together and means connecting said emitters together, an input signal source comprising a bridge circuit having an impedance balance responsive to an external condition connected between said emitters and said bases, a source of alternating current power for energizing said bridge at a given frequency, a current sensitive load device, and means for coupling said power source and said load device in series between said collector electrodes to provide a pulsating direct output current reversible in polarity with phase reversal of said input signal.

8. A phase sensitive amplifier comprising similarly polarized first and second junction transistors each having emitter, base, and collector electrodes, means connecting said bases and said emitters respectively together, an alternating input signal source of given frequency subject to phase reversal and a source of bias current connected in series between said emitters and said bases, a source of alternating current power of said frequency, a load device sensitive to direct current direction and amplitude, and means connecting said power source and said load device in series between said collector electrodes to provide a pulsating direct output current reversible in polarity with phase reversal of said input signal.

9. Means for measuring phase difference between signals of first and second alternating current sources comprising a pair of similarly polarized transistors each having their base electrodes connected to one terminal of the first of said sources and their emitter electrodes connected to the other terminal of said first of said sources, means connecting one terminal of said second source to one of said collector electrodes and means connecting a direct current load device between the other of said collector electrodes and the other terminal of said second source to provide a unidirectional signal varying in amplitude with the relative phase of said sources.

10. A phase sensitive amplifier comprising an alternating signal source, an alternating current power source, a pair of similarly polarized junction transistors each having base, emitter, and collector electrodes, and a source of direct bias current connected in series with said alternating signal to form an input circuit, means connecting said input circuit between a common terminal for said base electrodes and a second common terminal for said emitter electrodes, an output circuit comprising a load device connected in series with a source of alternating current power, said output circuit being connected between said collector electrodes to provide a pulsating output signal responsive to phase and amplitude modulation of said input signal.

11. Means for comparing signals of first and second alternating current sources respectively, comprising a pair of similarly polarized transistors each having their base electrodes connected to one terminal of the first of said sources and their emitter electrodes connected to the other terminal of said first of said sources, means connecting one terminal of said second source to one of said collector electrodes and means connecting a direct current load device between the other of said collector electrodes and the other terminal of said second source to provide a comparison signal current therethrough.

12. Means for measuring frequency difference between signals of first and second alternating current sources comprising a pair of similarly polarized transistors each having their base electrodes connected to one terminal of the first of said sources and their emitter electrodes connected to the other terminal of said first of said sources, means connecting one terminal of said second source to one of said collector electrodes and means connecting a frequency responsive load device between the other of said collector electrodes and the other terminal of said second source to provide an output signal corresponding in frequency to the frequency difference of said sources.

References Cited in the file of this patent

UNITED STATES PATENTS

| | | |
|---|---|---|
| 2,457,278 | Schoenbaum | Dec. 28, 1948 |
| 2,524,051 | Goertz | Oct. 30, 1950 |
| 2,589,721 | McNaney | Mar. 18, 1952 |
| 2,617,864 | Johnson | Nov. 11, 1952 |
| 2,666,819 | Raisbeck | Jan. 19, 1954 |
| 2,698,392 | Herman | Dec. 28, 1954 |
| 2,713,130 | Weiller | July 12, 1955 |